United States Patent [19]
Werthner

[11] Patent Number: 5,798,643

[45] Date of Patent: Aug. 25, 1998

[54] METHOD FOR OPERATING AN NMR TOMOGRAPHY APPARATUS SUITABLE FOR USE WITH A CHRONOLOGICALLY CONSTANT BASIC MAGNETIC FIELD INHOMOGENEITY

[75] Inventor: Harald Werthner, Fuerth, Germany

[73] Assignee: Siemens Aktiengesellschaft, Munich, Germany

[21] Appl. No.: 814,241

[22] Filed: Mar. 11, 1997

[30] Foreign Application Priority Data

Mar. 27, 1996 [DE] Germany ............... 196 12 217.1

[51] Int. Cl.$^6$ .................................................. G01V 3/00
[52] U.S. Cl. .................................... 324/309; 324/314
[58] Field of Search ................................ 324/314, 307, 324/306, 309, 300

[56] References Cited

U.S. PATENT DOCUMENTS

| | | | |
|---|---|---|---|
| 5,422,572 | 6/1995 | Yao | 324/314 |
| 5,572,126 | 11/1996 | Shinnar | 324/314 |
| 5,619,138 | 4/1997 | Rourke | 324/314 |

FOREIGN PATENT DOCUMENTS

| | | |
|---|---|---|
| OS 42 16 969 | 11/1993 | Germany. |
| OS 44 35 104 | 4/1996 | Germany. |
| OS 195 11 835 | 10/1996 | Germany. |

OTHER PUBLICATIONS

"SPI–Single Point FID Imaging," Nauerth, SMRM '93, p. 1215.
"Frequency–Modulated Radiofrequency Pulses in Spin–Echo and Stimulated–Echo Experiments" Kunz, Magnetic Resonance in Medicine, vol. 4, (1987), pp. 129–136.
"Use of Frequency–Modulated Radiofrequency Pulses in MR Imaging Experiments," Kunz, Magnetic Resonance in Medicine, vol. 3, (1986), pp. 377–384.

Primary Examiner—Louis M. Arana
Attorney, Agent, or Firm—Hill & Simpson

[57] ABSTRACT

In a method in the form of a single pulse sequence for operating a nuclear magnetic resonance tomography apparatus, suitable for use with a chronologically constant inhomogeneity of the basic magnetic field N radio-frequency excitation pulses (N<2), spaced with a time spacing T, are emitted onto an examination subject, under the effect of a magnetic field gradient in a first direction, the radio-frequency excitation pulses respectively having different frequency bands adjoining one another. Subsequently, radio-frequency refocusing pulses spaced with a time spacing of T/2 are emitted, with the nth radio-frequency excitation pulse and the nth radio-frequency refocusing pulse having respective frequency bands that substantially agree.

10 Claims, 3 Drawing Sheets

METHOD FOR OPERATING AN NMR TOMOGRAPHY APPARATUS SUITABLE FOR USE WITH A CHRONOLOGICALLY CONSTANT BASIC MAGNETIC FIELD INHOMOGENEITY

BACKGROUND OF THE INVENTION

1. Field of the Invention

The present invention is directed to a method, in the form of a pulse sequence, for operating a nuclear magnetic resonance tomography apparatus, and in particular to a method which is suitable for operating a tomography apparatus of the type having a chronologically constant (permanent) inhomogeneity of the basic magnetic field.

2. Description of the Prior Art

Nuclear magnetic resonance tomography is conventionally carried out using a basic magnetic field with a high degree of homogeneity, otherwise spatial distortions of the subject will arise with conventional pulse sequences. It is expensive, however, to manufacture magnets with the homogeneity normally required. In particular, given Helmholtz arrangements, as are standard e.g. for superconducting magnets, this is successful only for a certain minimum length of the magnet. In pole shoe magnets, such field homogeneity can be achieved only if the ratio of the pole shoe surface to the pole shoe spacing does not fall below a certain value. The required structural length or pole shoe surface leads not only to high expense but also to a limitation of accessibility to the examination volume, and with tube-shaped magnets also leads to increased problems with patient claustrophobia. For interventional nuclear magnetic resonance tomography, accessibility to the patient is an essential factor.

Both from the point of view of cost and with regard to interventional applications, imaging methods are thus desirable that yield usable results even with larger magnetic field inhomogeneities. Problems thereby arise both in the excitation phase and in the readout phase. There are a number of solutions for avoiding the image distortions connected with a readout gradient. An example is the single-point imaging method as described in SMRM Abstracts 1993, page 1215, among other sources. A method of this sort enables imaging in an inhomogeneous field by replacing the readout gradient with phase coding steps. Additional pulse sequences for imaging in the inhomogeneous field are, for example, described in German OS 195 42 964 and OS 44 35 104. In German OS 195 11 835, a pulse sequence is described that is specifically suited for a magnet with a predetermined, chronologically constant (permanent) inhomogeneity in a first spatial direction, with the inhomogeneity being lower at least in the direction of the readout gradient. A magnet in which a substantial inhomogeneity is allowed in one spatial direction is simpler to construct than conventional magnets with high homogeneity requirements in all spatial directions.

As noted above, however, an inhomogeneous basic field causes a problem not only in the readout phase but also in the excitation phase. Previously, amplitude-modulated excitation pulses were generally used, namely a sync pulse, as shown in FIG. 1. FIG. 2 shows the desired rectangular frequency profile. The frequency spectrum should exhibit a constant value A in a frequency range between $-f_o$ and $f_o$, and should exhibit the value 0 outside this frequency range. The associated sync pulse must then exhibit an amplitude $2*A*f_o$. In addition, there is a reciprocal relationship between the bandwidth and the pulse duration.

Given a predetermined slice thickness, the required bandwidth of the radio-frequency excitation pulse is proportional to the magnet field gradient applied. In the case under consideration, the magnetic field gradient is determined by the inhomogeneity. If a very strong inhomogeneity is present, a large bandwidth of the radio-frequency excitation pulse is thus required. Due to the relationship explained above, this means that the sync pulse must become very narrow. Since the achieved flip angle is proportional to the time integral of the sync pulse, this requires that the amplitude of the sync pulse be correspondingly increased. Due to the hardware components, this amplitude is limited to the maximum radio-frequency peak power. With conventional amplitude-modulated radio-frequency pulses, only very thin slices thus can be excited given larger inhomogeneities, due to the limited bandwidth. Therefore, only very thin slices can be acquired with a single exposure. Moreover, a sufficient signal is no longer obtained if the excited slices become too thin.

The above-described problem can be solved by the use of frequency-modulated radio-frequency excitation pulses. Such frequency-modulated radio-frequency excitation pulses are specified for example in the references D. Kunz, "Frequency-modulated radio-frequency pulses in spin-echo and stimulated echo experiments," Magn. Reson. Med. 4, 129–136 (1987), and D. Kunz, "Use of frequency-modulated radio-frequency pulses in MR imaging experiments," Magn. Reson. Med. 3, 377–384 (1986). In comparison with amplitude-modulated pulses, however frequency-modulated radio-frequency excitation pulses, also called chirp pulses, have a non-linear relation between the radio-frequency amplitude and the flip angle. This non-linear relation is also responsible for the fact that chirp pulses cause a higher specific radio-frequency absorption (SAR, Specific Absorption Rate) than do amplitude-modulated pulses with the same flip angle and the same bandwidth. For a flip angle of $\alpha=180°$, the SAR for a chirp pulse is about twice as high as for the corresponding amplitude-modulated pulse. Since the patient's radio-frequency exposure must be limited, in the application of frequency-modulated radio-frequency pulses the repetition rate is limited, particularly for large flip angles.

SUMMARY OF THE INVENTION

An object of the present invention is to provide a method in the form of a pulse sequence for operating a nuclear magnetic resonance tomography apparatus so that a slice excitation with a sufficient slice thickness is possible in strongly inhomogeneous basic magnetic fields, or under strong magnetic field gradients.

The above object is achieved in accordance with the principles of the present invention in a method for operating a nuclear magnetic resonance tomography apparatus, in the form of a pulse sequence. The pulse sequence begins with N(N>2) radio-frequency excitation pulses which are emitted into an examination subject in the presence of a magnetic field gradient in a first direction. The radio-frequency excitation pulses are spaced from each other by a chronological spacing T, and have respectively different frequency bands, with the frequency bands being successive. After a time interval following the last radio-frequency excitation pulse, N radio-frequency refocussing pulses are emitted, also in the presence of the magnetic field gradient in the first direction. The radio-frequency refocussing pulses are emitted with a chronological spacing from each other of T/2. The radio-frequency refocussing pulses are also emitted with respectively different frequency bands, and the respective frequency bands of the radio frequency refocussing pulses agree, in the same sequence, with the respective frequency bands of the radio-frequency excitation pulses. In other words, the nth radio-frequency excitation pulse has a frequency band which agrees with the frequency band of the nth radio-frequency refocussing pulse. A spin echo signal is then read out, which contains signal contributions from all of the radio frequency excitation pulses.

The magnetic field gradient in the first direction can be a chronologically constant (permanent) inhomogeneity of the basic magnetic field, such as in the z-direction of a Cartesian coordinate system. One or more magnetic field gradients in directions perpendicular to the direction of the first direction can be generated for phase-encoding the nuclear spins before reading out the spin echo signal.

A slice selection of the examination subject can be defined by the combination of the radio-frequency excitation pulses, the radio frequency refocussing pulses and the magnetic field gradient in the first direction, with only one measurement value of the spin echo signal being sampled. It is also possible to obtain a number of measurement values of the spin echo signal by sampling in a time raster.

DESCRIPTION OF THE PREFERRED EMBODIMENTS

Figure 3:
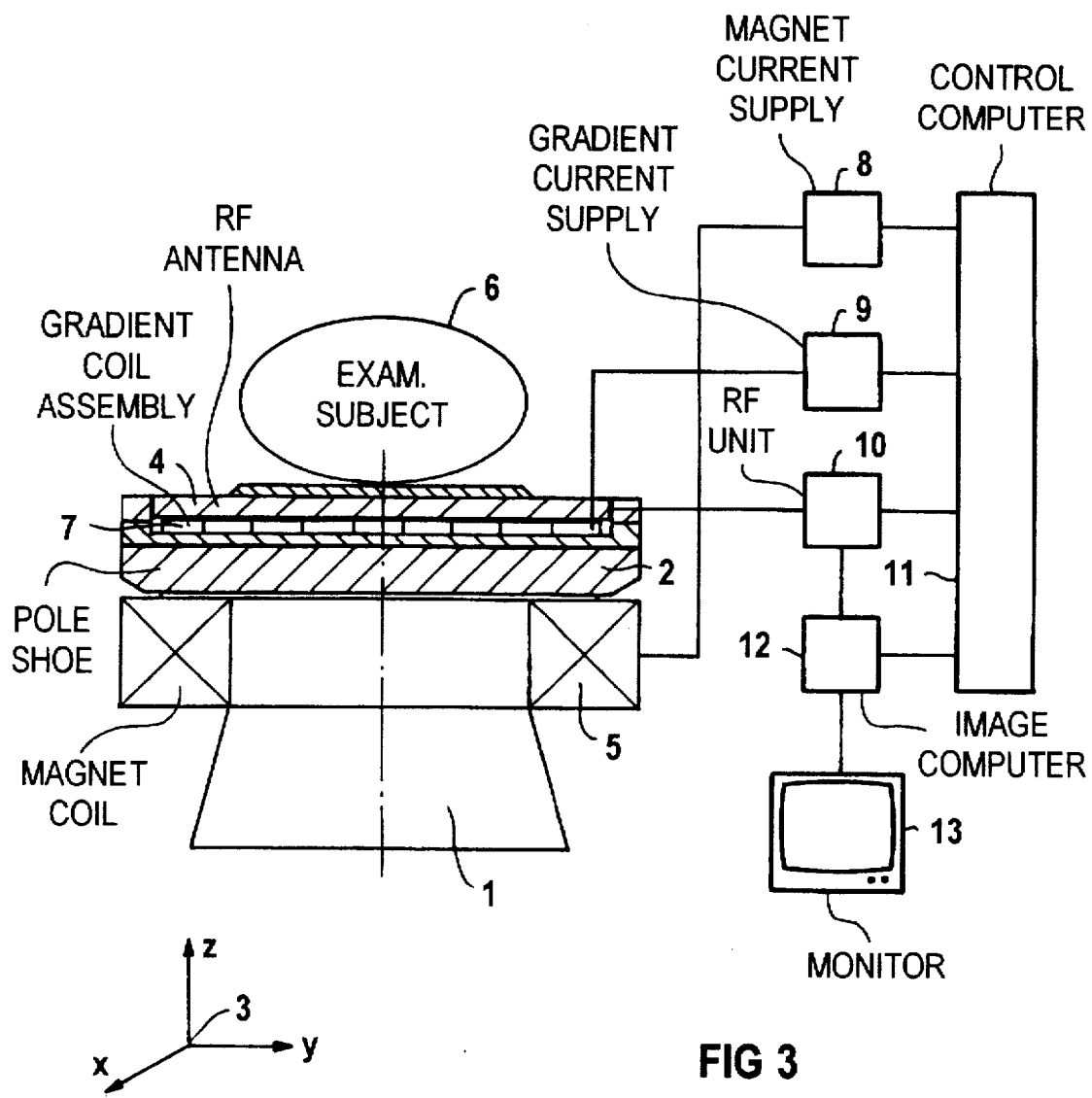
FIG. 3 shows an open magnet arrangement, of a type suited for operation in accordance with the method.
Figure 6:
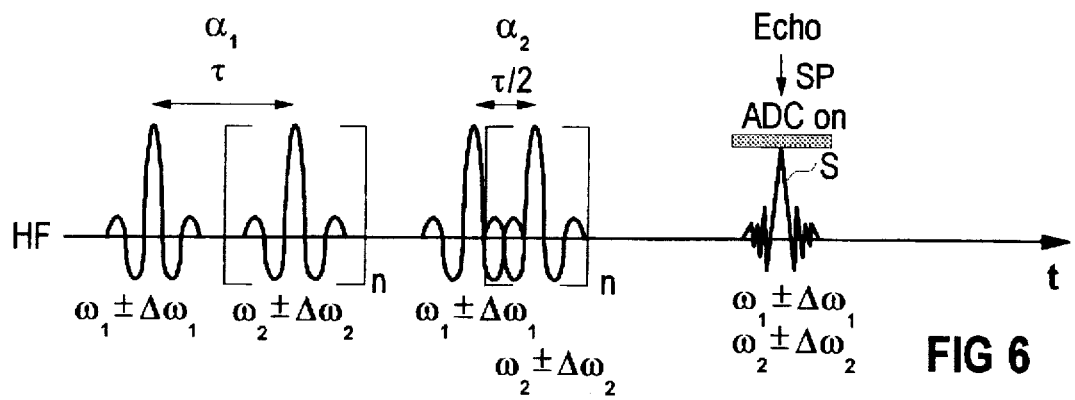
FIGS. 6–9 schematically show a complete pulse sequence as an exemplary embodiment for the method.
Figure 7:
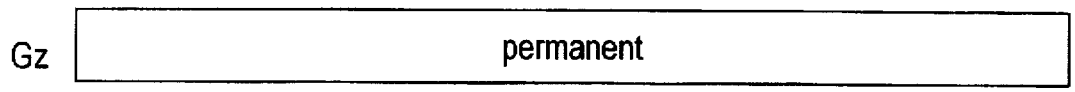
Figure 8:
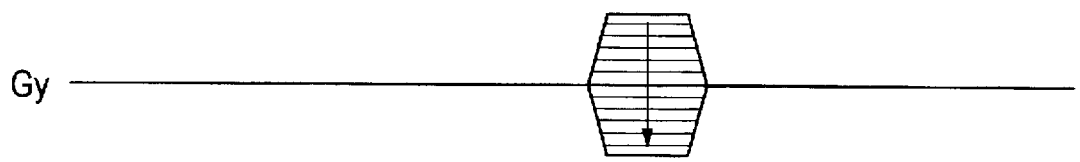
Figure 9:
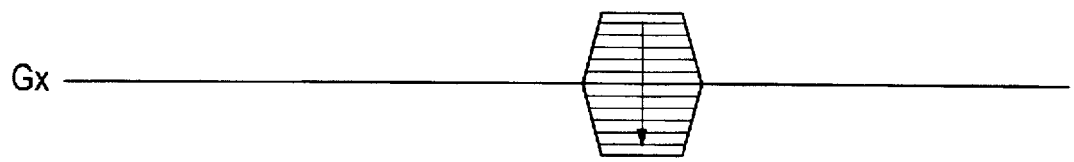

FIG. 3 schematically shows a particularly simple magnet design for which the inventive method is suited. The magnet system stands on a base 1 and has only one pole shoe 2. In the exemplary embodiment according to FIG. 3, the magnetic drive ensues by means of a normally conducting magnet coil 5; however, the drive can also be implemented as a permanent magnet. In the area of the pole shoe 2, gradient coil assemblies 7 and radio-frequency antennas 4 are attached. In contrast to conventional arrangements, in which three gradient coil assemblies are required for three spatial directions perpendicular to one another, here only two gradient coil assemblies are provided for two spatial directions, which is further explained below. In the exemplary embodiment, the radio-frequency antenna 4 serves both for transmission and for reception of signals. An examination subject 6 is positioned on the magnet system. The construction shown corresponds in some parts to a magnet system as explained in more detail in U.S. Pat. No. 5,200,701, but with the important difference that only one pole shoe and only two gradient coil assemblies are present.

The magnetic coil 5 is fed by a magnet current supply 8, and the gradient coil assemblies 7 are fed by a gradient current supply 9. The antenna 4 is connected to a radio-frequency unit 10. Using an image computer 12, an image is reconstructed from the signals obtained from the radio-frequency unit, which image is displayed on a monitor 13. The magnet current supply 8, the gradient current supply 9, the radio-frequency unit 10 and the image computer 12 are controlled by a control computer 11.

Figure 1:
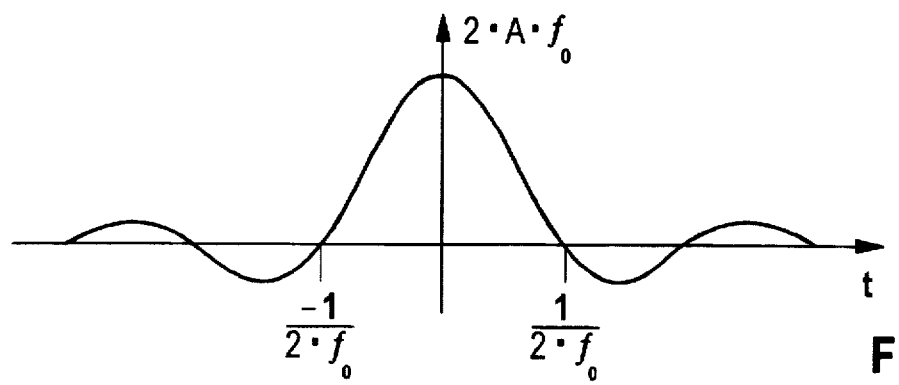
FIG. 1, as noted above, shows an example of an amplitude-modulated excitation pulse as has been conventionally used, in the form of a sync pulse.
Figure 2:
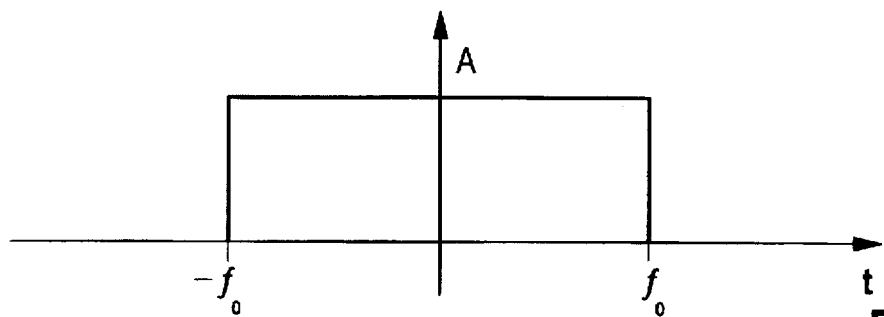
FIG. 2, as noted above, shows the rectangular frequency profile of the sync pulse shown in FIG. 1.

In this construction, there necessarily results in the area of the examination subject 6 a relatively strong magnetic field gradient perpendicular to the pole shoe 2, thus in the z direction according to the coordinate system 3 shown in FIG. 1. The curve of this gradient, however, can be calculated precisely. Given a corresponding design of the magnet system, a relatively good homogeneity can be achieved in the x and y directions, which are perpendicular to the z direction.

The magnet according to FIG. 3 represents an example of a so-called z1 design, which is particularly suited for the application of the pulse sequence specified herein. The z1 design is characterized by a basic field that increases in a strongly linear fashion along the z direction. The inhomogeneity in the two other spatial directions is (dependent on the particular design) essentially lower, and gradient coils are required only for these directions. The arrangement with only one pole shoe has the advantage that access to the patient is completely unhindered during the examination and for possible interventional procedures.

The pulse sequence specified below, however, works in principle with arbitrary inhomogeneities, however the additional problems known from conventional imaging methods then arise, e.g. ambiguities in the slice selection (curved slices and variations in slice thickness).

Figure 4:
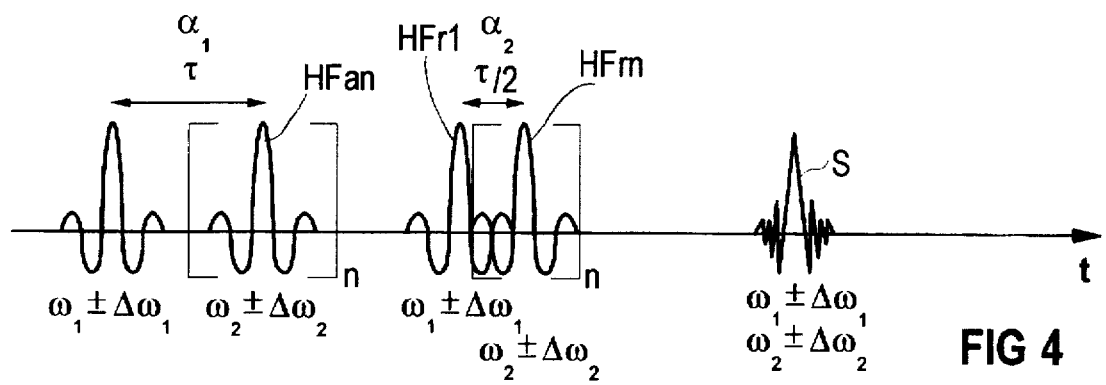
FIG. 4 shows the sequence of radio-frequency pulses according to the inventive method.

FIG. 4 shows an exemplary embodiment of a possible realization of amplitude-modulated radio-frequency pulses according to the invention. N radio-frequency excitation pulses HFa1–HFaN are emitted with a chronological spacing T. The individual radio-frequency excitation pulses are emitted as sync pulses, and have respectively different bandwidths ($\omega 1 \pm \Delta\omega 1$) to ($\omega N \pm \Delta\omega N$), following one another in succession. For example, the first radio-frequency excitation pulse HFa1 with the flip angle $\alpha 1$ is modulated with the frequency $\omega 1$ and covers the bandwidth $\omega 1 \pm \Delta\omega 1$. The second radio-frequency excitation pulse HFa2 likewise has a flip angle $\alpha 1$; this pulse is emitted with a chronological displacement T and is modulated with the frequency $\omega 2$ and covers a bandwidth $\omega 2 \pm \Delta\omega 2$. So that no gaps arise in the frequency band, $\omega 1 + \Delta\omega 1 = \omega 2 - \Delta\omega 2$. The corresponding relation holds for all subsequent radio-frequency excitation pulses.

Figure 5:
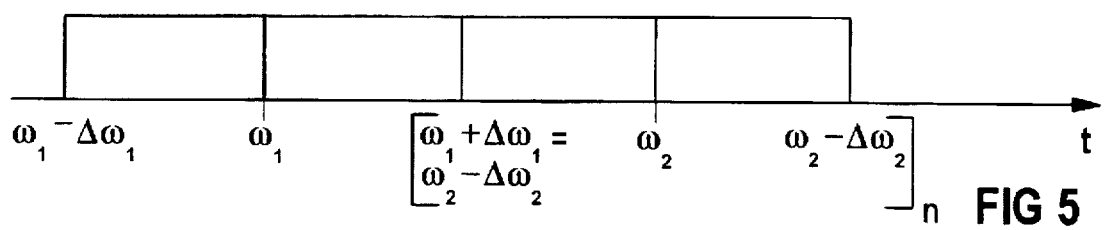
FIG. 5 shows the respective bandwidths of the radio-frequency pulses of FIG. 4.

With these radio-frequency excitation pulses HFa1–HFaN, an overall bandwidth results during excitation that corresponds to the sum of the bandwidths of the individual radio-frequency excitation pulses. This is shown schematically in FIG. 5. A slice thickness is thereby excited that is predetermined by the magnetic field gradients (or the magnetic field inhomogeneity) that are effective during the excitation, and by the sum of the bandwidths of the individual radio-frequency excitation pulses.

After the excitation, N radio-frequency refocusing pulses HFr1–HFrN follow. These have a chronological displacement relative to one another that is half as large as during the excitation, thus T/2. The modulation frequency wn and the bandwidth $\pm \Delta\omega n$ of the radio-frequency refocusing pulse HFrn corresponds to the respective values of its associated radio-frequency excitation pulse HFan. The flip angles of the radio-frequency refocusing pulses HFr amount to $\alpha 2$.

Each radio-frequency excitation pulse HFan produces a spin echo signal S in combination with its associated radio-frequency refocusing pulse HFrn. By means of the above-described chronological correlation of radio-frequency excitation pulses HFan and radio-frequency refocusing pulses HFrn, it is achieved that all the spin echo signals generated in this way coincide chronologically to form a single spin echo signal S.

Thus, with the pulse sequence shown it is possible to achieve the effect of a broadband excitation with amplitude-modulated radio-frequency pulses, without requiring that an individual radio-frequency pulse to have an extremely large bandwidth, which would lead to the problems explained above. By virtue of the resulting large bandwidth, sufficiently thick slices can be excited even in strong magnetic field gradients.

A maximum signal amplitude of the spin echo signal is obtained if the flip angle $\alpha 1$ of the radio-frequency excitation pulse is selected HFa=90° and the flip angle $\alpha 2$ of the radio-frequency refocusing pulse is selected HFr=180°. In strongly inhomogeneous fields, it can, however, be useful to select the flip angle somewhat smaller in order to further reduce the required radio-frequency peak power, which limits the bandwidth of the individual radio-frequency pulse for the reasons explained above. The individual radio-frequency pulse can then have a larger bandwidth, so that the required total number of radio-frequency pulses is reduced.

The individual radio-frequency pulses, in particular the radio-frequency refocusing pulses HFr, can be added so as to overlap slightly, in order to shorten the overall pulse duration of the combined radio-frequency pulses for excitation and refocusing. This enables shorter echo times, or can lead to an increase in the number N of pulses in order to realize a larger overall bandwidth. During the overlapping of the radio-frequency pulses, care must be taken that the main maxima of the N radio-frequency pulses to be overlapped are still sufficiently separated. In the boundary case of complete overlap, a sync radio-frequency pulse is obtained that is narrower by a factor of N, with N-fold amplitude. This corresponds to the conventional case, in which the given bandwidth is excited with an individual, sync-shaped radio-frequency pulse.

FIGS. 6–9 show, as an exemplary embodiment of the invention, a complete pulse sequence with the excitation explained above. The permanent gradient Gz in the z direction thereby symbolizes the linear basic field inhomogeneity, which is effective both during excitation and during the reading out of the spin echo signal S. Before read out phase, the nuclear resonance signal is phase-encoded in a conventional way by gradients in the y direction (Gy) or in the x direction (Gx).

Two possibilities for the readout phase are shown in FIGS. 6–9. If the permanent gradient Gz is sufficiently linear, it can be used as a readout gradient. In this case, the entire spin-echo signal S is sampled scanned during a time interval designated "ADC on" in FIG. 6. The sampled values are digitized, and the m values thus obtained are entered into a row of a raw data matrix. The represented pulse sequence is repeated in iterations with n different values of the phase coding gradient Gy and with o different values of the phase coding gradient Gx, so that overall a three-dimensional raw data matrix with m*n*o values is obtained. A three-dimensional image data set can be obtained from this raw data matrix in a conventional way by means of three-dimensional Fourier transformation. By virtue of the gradient Gz that is effective during the readout phase, another locus resolution within the excited slice ensues, so that a three-dimensional volume is actually excited, from which a three-dimensional image data set is obtained.

If the permanent gradient Gz is non-linear, corresponding image distortions result in the z direction with the method described above. This can be avoided if the single-point technique, already mentioned above, is used. The spin echo signal S is thereby sampled only at a single point, designated SP in FIG. 6. Only a single measurement point in the raw data space is thus obtained per pulse sequence. By m-fold repetition of the sequence with different phase coding gradients Gy and n-fold repetition of the sequence with different phase coding gradients Gx, after m*n pulse sequences a two-dimensional m*n raw data matrix is obtained, from which a two-dimensional image data matrix can in turn be obtained by two-dimensional Fourier transformation. In this method, no locus resolution ensues in the z direction, but it is not sensitive to non-linearities of the magnetic field gradient $G_z$.

With the sequence represented above, also referred to by the acronym SELFI (Spin Echo for Large Field Inhomogeneities), it is thus possible to excite sufficient slice thicknesses even in large inhomogeneities. This would not be possible with individual amplitude-modulated pulses in a spin echo sequence, since the maximum radio-frequency peak power predetermined by the hardware components of an MR installation imposes a lower limit for the radio-frequency pulse duration and thus also imposes an upper bound of the achievable bandwidth. An upper bound for the inhomogeneity is also produced, which can be overlapped with an individual amplitude-modulated pulse. With the indicated method, this boundary can be exceeded without hardware expansions. In relation to frequency-modulated pulses that could be unproblematically executed in broader-band fashion, the method disclosed herein has the advantage that the flip angles of the pulses used depend in linear fashion on the strength of the basic magnetic field. The specific absorption rate (SAR), i.e. the radio-frequency exposure of the patient, is reduced in relation to frequency-modulated pulses. This is important for the case of strongly inhomogeneous fields, since higher SAR values can be reached thereby than for conventional homogeneous magnetic fields. A further advantage of the pulse sequence described herein is its simple implementation, since it can be implemented using conventional RF pulse shapes.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for operating a nuclear magnetic resonance tomography apparatus, comprising the steps of:

emitting N(N>2) radio-frequency excitation pulses into an examination subject in the presence of a magnetic field gradient, said radio-frequency excitation pulses being spaced from each other by a chronological spacing T and having respectively different frequency bands, said frequency bands being successive;

after a time interval following a last of said radio-frequency excitation pulses, emitting N radio-frequency refocusing pulses in the presence of said magnetic field gradient, said radio-frequency refocusing pulses having a chronological spacing from each other of T/2 and having respectively different frequency bands, with the frequency band of an nth radio-frequency excitation pulse agreeing with the frequency band of a nth radio-frequency refocusing pulse; and reading out a spin echo signal from said examination subject containing signal contributions produced by all of said radio frequency excitation pulses.

2. A method as claimed in claim 1 wherein the step of emitting said radio-frequency refocusing pulses comprises emitting N radio-frequency refocusing pulses with successive radio-frequency refocusing pulses at least partially chronologically overlapping.

3. A method as claimed in claim 2 wherein the step of emitting said radio-frequency excitation pulses comprises emitting N radio-frequency excitation pulses with successive radio-frequency excitation pulses at least partially chronologically overlapping.

4. A method as claimed in claim 1 wherein the step of emitting said radio-frequency excitation pulses comprises emitting N radio-frequency excitation pulses each having a flip angle of approximately 90°.

5. A method as claimed in claim 4 wherein the step of emitting said radio-frequency refocusing pulses comprises emitting N radio-frequency refocussing pulses each having a flip angle of approximately 180°.

6. A method as claimed in claim 1 comprising the additional step of producing said magnetic field gradient by generating a basic magnetic field with a chronologically constant inhomogeneity therein.

7. A method as claimed in claim 1 wherein said magnetic gradient comprises a magnetic field gradient in a first direction of a Cartesian coordinate system and comprising the additional step of generating a phase-encoding gradient in a second direction of said Cartesian coordinate before reading out said spin echo signal.

8. A method as claimed in claim 7 comprising the additional step of generating a further phase-encoding gradient in a third direction of said Cartesian coordinate system before reading out said spin echo signal.

9. A method as claimed in claim 1 comprising the additional steps of:

selecting a slice of said examination subject by a combination of said radio-frequency excitation pulses, said radio frequency refocusing pulses and said magnetic field gradient; and obtaining only one measurement value of said spin echo signal by sampling.

10. A method as claimed in claim 9 comprising the additional step of repeatedly emitting said radio frequency excitation pulses and said radio-frequency refocusing pulses in the presence of said magnetic field gradient to obtain a plurality of measurement values of the spin echo signal sampled in a time raster.

* * * * *